United States Patent [19]

Biehl et al.

[11] 4,437,063
[45] Mar. 13, 1984

[54] SPECIMEN HEAD FOR ELECTRON SPIN RESONANCE AND PARAMAGNETIC ELECTRON RESONANCE MEASUREMENTS

[75] Inventors: Reinhard Biehl, Karlsruhe; Dieter Schmalbein, Marxzell-Burbac, both of Fed. Rep. of Germany

[73] Assignee: Bruker Analytische MeBtechnik GmbH, Fed. Rep. of Germany

[21] Appl. No.: 288,582

[22] Filed: Jul. 30, 1981

[30] Foreign Application Priority Data

Aug. 6, 1980 [DE] Fed. Rep. of Germany ....... 3029754

[51] Int. Cl.$^3$ ........................................... G01R 33/08
[52] U.S. Cl. .................................................. 324/316
[58] Field of Search ............... 324/300, 315, 316, 318; 333/229

[56] References Cited

U.S. PATENT DOCUMENTS

| | | | |
|---|---|---|---|
| 3,108,240 | 10/1963 | Riblet | 333/229 |
| 3,623,146 | 11/1971 | Kaneko | 333/229 |
| 3,691,453 | 9/1972 | Rupp | 324/316 |

OTHER PUBLICATIONS

J. MacKinnon, Variable Temperature X-Band EPR System with a Variable Cavity Coupler, Rev. Sci. Inst., vol 43, No. 12, pp. 1847–1849, Dec. 1972.

*Primary Examiner*—Michael J. Tokar
*Attorney, Agent, or Firm*—William D. Hall

[57] ABSTRACT

A specimen head for electron spin resonance and paramagnetic electron resonance measurements, having an annularly cylindrical resonator, with a waveguide being coupled to one of its end walls in such a manner as to excite an $H_{011}$ wave. The other end wall is formed by a piston capable of being shifted for tuning, the piston being attached at the end of a hollow piston rod (6) mounted in a bearing block (4), which also contains the resonator (16), in such a manner that it is concentric relative to the axis of the resonator and longitudinally shiftable. The waveguide (13) is attached to the bearing block (4) on that side of the resonator (16) which is opposite the piston (7) and extends along the outside of the bearing block parallel to the piston rod (6) after having been deflected 180°. Drive shafts (24, 34) for means for shifting the piston (7) and means for altering the coupling of the waveguide (13) are arranged on that side of the piston rod (6) opposite the waveguide (13) in the plane containing the axes of the waveguide and the piston rod (6) and are mounted in or on the bearing block (4). The bearing block (4) is attached to a head member (1) by means of rods (3) extending parallel to the waveguide (13) and to the drive shafts (24, 34), with the free end of the waveguide (13) being attached thereto and the free ends of the drive shafts (24, 34) being mounted therein, and having a hole (48) which is concentric relative to the piston rod (6).

16 Claims, 7 Drawing Figures

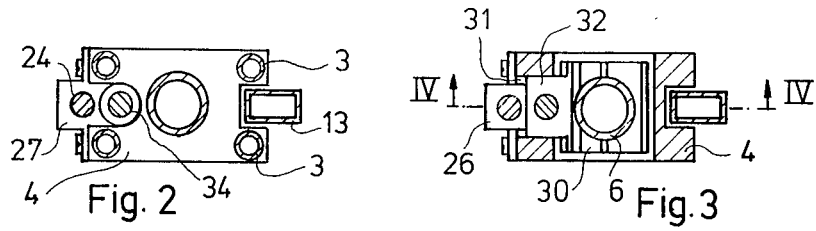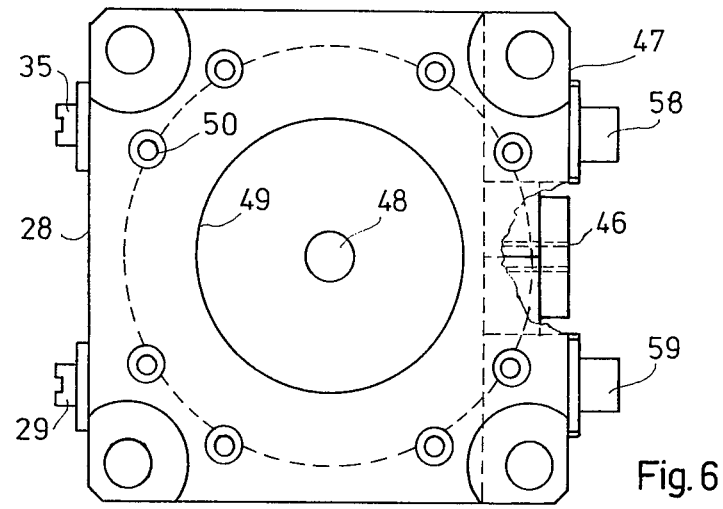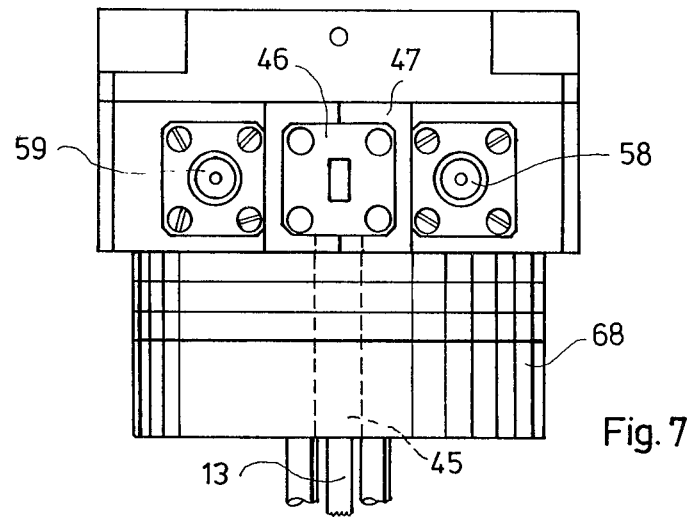

SPECIMEN HEAD FOR ELECTRON SPIN RESONANCE AND PARAMAGNETIC ELECTRON RESONANCE MEASUREMENTS

The present invention relates to a specimen head for electron spin resonance and paramagnetic electron resonance measurements, having an annularly cylindrical resonator, with a waveguide being coupled to one of its end walls in such a manner as to excite an $H_{011}$ wave in the resonator, the other end wall being formed by a piston capable of being shifted for tuning, the piston having a concentric opening for introducing a specimen into the resonator, the specimen head also having means for shifting the piston and for altering the coupling of the waveguide to the resonator.

The spectrometers which are equipped for electron spin resonance and paramagnetic electron resonance measurements operate at frequencies in excess of 24 GHz and are designed as reflection spectrometers for continuous-duty operation. The resonance measurements necessitate that both the resonator be tuned and the resonator resistance be matched to the arrangement of the waveguide. Moreover, many of these resonance measurements are performed at cryogenic temperatures, ranging down to approx. 4 K. When the resonator cools to these cryogenic temperatures, its resistance changes, as the conductivity of the resonator walls, and thus the quality of the resonator, is a function of temperature. Moreover, the dimensions of the resonator, and thus its resonance frequency, also change when cooled. For this reason, there is a need for being able to set the tuning and the coupling of the resonator even when the resonator is contained in liquid helium, for example.

Furthermore, there is a need for being able to change specimens while the specimen head is maintained at cryogenic temperatures, i.e. in particular when it is contained in liquid helium, in order to avoid having to heat up the specimen head to ambient temperature and then cool it down to cryogenic temperatures again for the new measurements everytime the specimen is changed, which would not only necessitate considerable cooling output, but also a significant amount of time, during which no measurements would be able to be performed. Moreover, for many measurements it is also necessary to be able to alter the orientation of the specimen in the resonator, and it would be advantageous if an alteration of the orientation of the specimen of this nature were able to be performed without having to interrupt the cooling process.

It is the object of the present invention to design a specimen head of the type mentioned at the outset in such a manner as to simultaneously satisfy all of the above-mentioned requirements.

According to the present invention, this object is solved in that the piston of the resonator is attached at the end of a hollow piston rod mounted in a bearing block, which also contains the resonator, in such a manner that it is concentric relative to the axis of the resonator and longitudinally shiftable, in that the waveguide, which is attached to the bearing block on that side of the resonator which is opposite the piston, extends along the outside of the bearing block parallel to the piston rod after having been deflected 180° C., in that drive shafts are arranged on that side of the piston rod opposite the waveguide in the plane containing the axes of the waveguide and the piston rod and are mounted in or on the bearing block, the drive shafts being employed for the means for shifting the piston, the means engaging the piston rod, and for the means for altering the coupling of the waveguide, and in that the bearing block is attached to a head member by means of rods extending parallel to the waveguide and the drive shafts, with the free end of the waveguide also being attached thereto and the free ends of the drive shafts being mounted therein, and having a hole which is concentric relative to the piston rod.

In the specimen head according to the present invention, the resonator, including the associated tuning means, can be arranged at a great distance from the head member, thereby permitting the resonator and the tuning means to be placed in a Dewar vessel and immersed in liquid helium, for example, while the head member can be attached at the open end of the Dewar vessel, where it is maintained at the ambient temperature. In doing so, all leads, connections and actuation elements are run to the head member and can be actuated therefrom. Thus, both tuning and coupling of the resonator can be performed by means of the drive shafts mounted in the head member. For example, a specimen can be introduced into the resonator by means of a rod, to whose end the specimen is attached, with the rod being introduced through the hole in the head member, which is in alignment with the piston rod, and the hollow piston rod itself. A rod of this type also permits the specimen to be rotated within the resonator. In addition, the specimen head also permits a goniometer to be arranged externally thereon, with the axis of rotation of the goniometer coinciding with the axis of the hole which is concentric relative to the piston rod, thereby permitting defined alteration of the orientation of the specimen in the resonator while the resonator is contained in liquid helium. Thus, the requirements stipulated at the outset are satisfied fully by the specimen head according to the present invention.

Moreover, a particular advantage of the specimen head according to the present invention is that the drive shafts and the waveguide are in a common diameter plane of the resonator. Consequently, the dimensions of the specimen head perpendicular to this plane can be kept relatively small. These dimensions are determined primarily only by the required diameter of the resonator. Thus, the specimen head according to the present invention can also be arranged in relatively narrow air gaps of the magnet required for generating the static magnetic field necessary for the resonance measurements if the specimen head and the above-mentioned plane are aligned parallel to the end surfaces of the poles.

A further advantage of this arrangement is that the resonator can be arranged in an exposed manner in a direction which is perpendicular to the above-mentioned plane, thereby permitting openings to be provided which allow light to enter and egress. Using the specimen head according to the present invention, it is then also possible to visually observe magnetic resonances by designing the rod holding the specimen as a fibre-optic rod, for example, and observing the light egressing from the resonator orthogonally to the light introduced (ODMR).

A further advantage of the specimen head is that it can be designed in a mechanically, and thus also thermally, symmetrical manner, thereby preventing the major changes in temperature, as well as temperature gradients, occurring during its use from having any disadvantageous effects on the function of the specimen head.

In a preferred embodiment of the invention, the drive shaft for the means for shifting the piston has a threaded portion, on which a travel nut connected with the piston rod is arranged. An arrangement of this type is very simple and dependable. In addition, it also offers the particular advantage of permitting mounting in a manner which is both free of play and jamming. In order to ensure mounting of this nature, the piston rod and the drive shafts can be mounted in two locations at a very great distance one from the other relative to the length of shift, whereby the piston rod and the drive shafts are mounted in these locations with radial play. With this arrangement, the hole in the travel nut has a slightly smaller clearance to the axis of the piston rod than that of the bearing bores for the drive shaft to the bearing bores for the piston rod, thereby permitting radial play to be eliminated, with minor flexure of the drive shaft between the bearing points. The large bearing bores relative to the diameter of piston rod and drive shaft prevent the piston rod and/or drive shaft from jamming in their bearings as a result of differing temperature coefficients. In order to provide optimum setting of the radial pretension produced by the sagging of the drive shaft, the drive shaft can further be mounted in bearing races attached in the bearing block, having eccentric holes for receiving the drive shaft, thereby permitting the pretension to be easily set by rotating the bearing races.

In a preferred embodiment of the invention, the means for altering the coupling of the waveguide include a rotatable slit diaphragm arranged between waveguide and resonator and being arranged at the end of a waveguide portion having an annular cross section, mounted rotatably about its longitudinal axis in the bearing block, eccentrically to the axis of the resonator, and being provided with a toothed rim, which is engaged by a gear arranged on the drive shaft for these means. In this case, the end wall of that portion of the waveguide which is contactlessly coupled with the waveguide which is rigidly connected with the bearing block forming the slit diaphragm can be pressed resiliently against the end surface of the resonator by means of a helical compression spring surrounding the waveguide portion and being in a contacting relationship with the toothed rim, on the one hand, and the bearing block, on the other. The basic design of these coupling means is the subject of prior German Patent Application No. P 3022481.8. This type of coupling is characterized by a very great variation capability and a design which incorporates a spring member and permits non-positive connection of the components, thereby preventing malfunctions as a result of play or jamming from occurring, even in the case of major changes in temperature. Thus, for example, the resonator can be formed in a simple manner by a tube portion inserted in the bearing block, which can comprise metallized ceramic and in which the piston engages in a contactless manner, on the one hand, with the other end thereof being terminated in a contactless manner as well through the resiliently pressed end wall forming the slit diaphragm.

In order to further prevent tensions caused by changes in temperature, the waveguide can be retained in the head member in such a manner that it can be longitudinally shifted. For the same reason, the drive shafts can comprise a plurality of portions connected one with the other in such a manner as to prevent rotation, however with longitudinal play. Furthermore, the upper ends of the drive shafts can be in engagement with gearing mounted in the head member, which permit the drive shafts to be actuated from the periphery of the head member.

Furthermore, for the purpose of thermal insulation the rods, the drive shafts and the waveguide have at least one portion adjacent to the head member, whereby this portion can comprise a material having low thermal conductivity.

And finally, the above-mentioned, flat design of the specimen head also permits a printed circuit board to be attached to at least one lateral surface of the bearing block, which extends parallel to the plane of the waveguide and the drive shafts, the printed circuit board permitting auxiliary means to be attached, whereby the auxiliary means can comprise temperature sensors, modulation coils, etc., in which case the leads are run from the printed circuit board to connectors arranged on the head member.

The above discussed and other objects, features, advantages and embodiments of the present invention will become more apparent from the following description thereof, when taken in connection with the practical examples shown in the accompanying drawings, in which FIG. 1 shows the side elevation of a specimen head according to the present invention, on a scale that is smaller than that employed in the other figures;

FIG. 2 shows a section taken along Line II—II through the specimen head in FIG. 1;

FIG. 3 shows a section taken along Line III—III through the specimen head in FIG. 1;

FIG. 6 shows a top view of the head member of the specimen head, in the direction of Arrow VI in FIG. 1; and FIG. 7 shows a side elevation of the head member in the direction of Arrow VII in FIG. 1.

Figure 1:
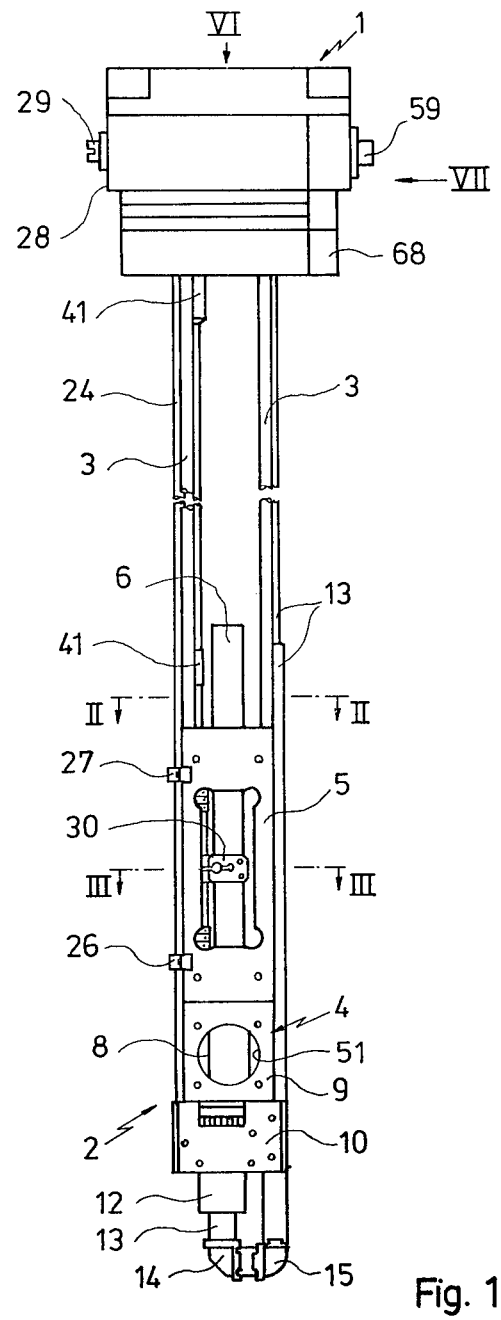

Referring now to the drawings, wherein like reference numerals designate like parts throughout the several views, the specimen head comprises a head member 1 and a resonator portion 2, connected one with the other by means of four parallel rods 3, arranged at the corners of a bearing block 4 of resonator portion 2. That portion of bearing block 4 which is adjacent to the head member forms a glideway 5 for a hollow piston rod 6, with a piston 7 being attached at the end of piston rod 6 facing away from head member 1, piston 7 extending into a tube portion 8 forming a resonator wall, without being in contact therewith. Tube portion 8 is arranged in a resonator cage 9 which follows glideway 5. The resonator cage is followed by a pivot bearing 10, in which a coupling link 11 is mounted in a rotatable manner. The coupling link is a waveguide portion having a circular cross section and being rotatable about its longitudinal axis; the coupling link is then followed by a transitional member 12, which also comprises a waveguide portion whose cross section changes from circular to rectangular. And finally, the transitional member is followed by a waveguide 13 having a rectangular cross section; this waveguide is deflected 180° by means of two 90° elbow joints 14 and 15 and then extends along the outside of bearing block 4, parallel to piston rod 6 and rods 3, to head member 1, in which the free end of the waveguide is retained.

Tube portion 8, which forms resonator 16, which can be of ceramic and can have a silver-plated interior surface, for example, is arranged in a hole in resonator cage 9, with its upper end being in a contacting relationship with a shoulder of this hole. The upper end of coupling link 11 has a toothed rim 17, which also forms a shoulder, against which the helical compression spring 18 surrounding coupling link 11 is supported in a contacting relationship, while its other end is supported in a contacting relationship with a shoulder 19 arranged at the lower end of pivot bearing 10. The upper end of coupling link 11 has a dielectric plate 20, which is metallized in an unillustrated manner on the side facing the waveguide portion 21 defined by coupling link 11, in which an unillustrated coupling slot is provided. Consequently, plate 20 forms a slit diaphragm, located between waveguide portion 21 and resonator 16. Helical compression spring 18 forces coupling link 11 against the lower end of tube portion 8 forming resonator 16. In waveguide portion 21 of coupling link 11, a Type $H_{11}$ wave is excited by rectangular waveguide 13 via transitional member 12, with the Type $H_{11}$ wave in turn exciting a Type $H_{011}$ wave in resonator 16 via the slit diaphragm in plate 20. In the case of this type of wave, no axially directed wall currents flow, so that the contactless termination of resonator 16 at its two ends by means of dielectric plate 20, on the one hand, and contactless piston 7, on the other, results in no problems. Moreover, the above-described components are movable in the axial direction one relative to the other, thereby permitting longitudinal compensation in the event of changes in temperature. Nevertheless, the resilient contact pressure of coupling link 11 against resonator tube 8 ensures proper termination of the resonator at all times. Arranged in a known manner at the transition between waveguide portion 21 in coupling link 11 and transitional member 12 is a half-wave trap, which is insensitive to minor alterations of the gap between the adjacent components, which are also not in contact one with the other.

Figure 4:
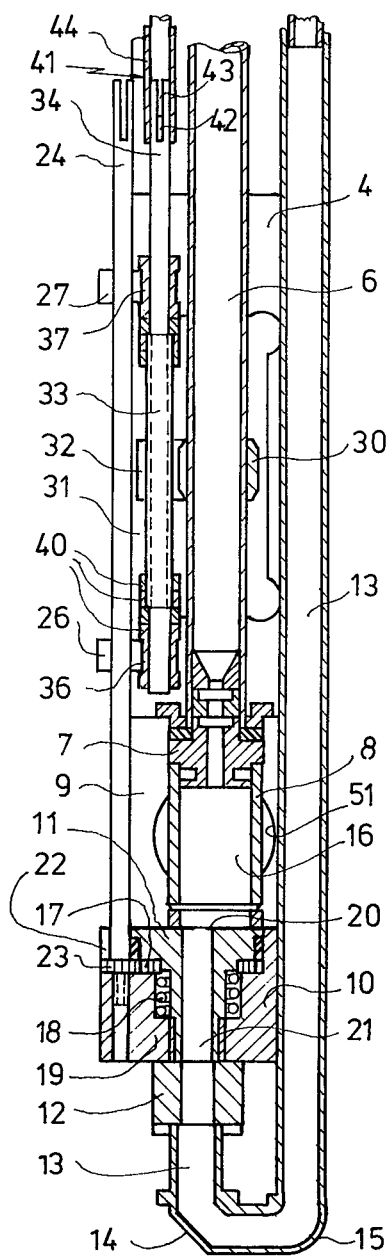
FIG. 4 shows a section taken along Line IV—IV in FIG. 3, through the resonator portion of the specimen head.

In order to permit the coupling of the resonator to waveguide 13 to be changed, the axis of waveguide portion 21 with the slit diaphragm is out of line with the axis of resonator 16, as can be seen clearly from FIG. 4. The dimension of the coupling of resonator 16 to waveguide 13 then depends upon the angle of the coupling slot in plate 20 with reference to the axis of coupling link 11. In order to permit coupling link 11 to be rotated, pivot bearing 10 has an opening 22 on one side, in which toothed rim 17 is exposed. Arranged at this point is a gear 23, which meshes with toothed rim 17 and is attached to a drive shaft 24, one end of which extends into a hole 25 in pivot bearing 10 and is further mounted in bearing blocks 26 and 27, which are attached to the outside of glideway 5. The drive shaft extends to head member 1, in which unillustrated gearing is arranged, which connects drive shaft 24 with a drive pin 29 extending from a lateral surface 28 of head member 1.

To permit piston 7 to be shifted relative to tube portion 8 in order to tune resonator 16, a travel nut 30 is attached to piston rod 6 in the area of glideway 5, by means of clamps, for example; travel nut 30 has a radial nose 32 which engages a longitudinal slot 31 in the glideway, nose 32 being provided with a threaded hole extending parallel to piston rod 6. Engaged with this threaded hole is a threaded portion 33 of a further drive shaft 34, which is also mounted in a rotatable manner in glideway 5, parallel to piston rod 6, however incapable of being shifted longitudinally. Drive shaft 34 also extends to head member 1 and is connected with unillustrated gearing arranged in the head member, the gearing having a drive pin 35 extending from lateral surface 28 of head member 1. Drive shaft 34 is mounted in bearing races 36, 37, which are arranged in corresponding recesses in glideway 5, being retained therein in a non-positive manner by means of bearing blocks 26 and 27. Drive shaft 34 is secured against axial shifting by means of locknuts 38, 39, which are arranged on threaded portion 33 of drive shaft 34.

In order to eliminate play, nose 32, with the threaded hole, of travel nut 30 has a slot 40 in a plane which is perpendicular to drive shaft 34, which permits the two slotted members to be tensioned relative to the thread on drive shaft 34. In order to further ensure that piston rod 6 is guided without play in the holes at the ends of glideway 5, without any risk of the piston rod jamming in the event of changes in temperature, these holes have a diameter that is somewhat greater than that of the piston rod, thereby ensuring that the piston rod has sufficient play in the holes. In spite of the larger bearing holes, guidance without play is nevertheless achieved in that the piston rod is forced resiliently and radially against the hole walls. This resilient pressure force is exercised by portion 33 of drive shaft 34. For this purpose, the radial clearance between the threaded hole in nose 32 of the travel nut and the axis of piston rod 6 is somewhat smaller than the radial clearance between the holes in bearing races 36, 37 and this axis. Consequently, portion 33 is subjected to minor flexure in the direction of piston rod 6, thereby exerting a resilient radial force on the piston rod. In order to be able to set the radial clamping force precisely, bearing races 36, 37 have eccentric holes, thereby permitting very fine setting of the radial clearances by rotating these bearing races. In order to simplify precise setting of the angle of the bearing races, they are provided with radial holes 40.

In order to further compensate for differing coefficients of expansion, drive shafts 24 and 34 are split in their longitudinal direction and provided with couplings 41, with one end of a shaft portion having a slot 42 and the other end of a shaft portion having a tang engaging in the slot. A sleeve 44 is slid over this connection. Moreover, the upper end of waveguide 13 is arranged in a slot 45 in the head member, in which it can be shifted longitudinally within certain limits. In the area of the head member, waveguide 13 has a further, unillustrated elbow joint, so that the connection flange 46 is also located on a lateral surface 47 of head member 1, on the opposite side from lateral surface 28, with drive pins 29 and 35 extending from lateral surface 28. Moreover, rods 3, waveguide 13 and drive shafts 24 and 34 are provided with portions having reduced thermal conductivity, which can consist of stainless steel, for example.

As can be seen from the drawing, drive shafts 24 and 34, as well as waveguide 13, are arranged in a common diameter plane of resonator 16 and piston rod 6. The extension of resonator portion 2 perpendicular to the plane is determined primarily only by the diameter of resonator 16. For this reason, the resonator portion can also be introduced into relatively narrow air gaps between the poles of a magnet. Furthermore, the design is also fully thermally symmetrical, thereby preventing any twisting or deformation from occurring as a result of differing thermal extension. The bottom of the head member has a cylindrical nose 68, which simplifies mounting the head member on a Dewar vessel. All actuation elements are arranged above this cylindrical nose and are easily accessible. A specimen can be introduced into the resonator through hollow piston rod 6 and piston 7, also provided with a bore, with the aid of a rod. To permit introduction of the rod, head member 1 has a hole 48, which is in alignment with piston rod 6. In addition, the top of head member 1 also has a cylindrical recess 49, which is concentric relative to hole 48, as well as a circle of threaded holes 50, arranged concentrically relative to hole 48, which permit a goniometer to be mounted on the head member, with which a rod, carrying the specimen and extending into resonator 16, can be rotated a precisely defined angle. If a rod of this nature is designed and employed as a fibre-optic rod, the illustrated specimen head also permits experiments with optically determined magnetic resonance to be performed, in which light is introduced in the axial direction of the resonator and is observed in phosphorescent or luminescent images perpendicular thereto. In investigating monocrystals, the polarisation of the egressing light is also observed. In this connection, it is only possible to rotate the plane of polarisation when observing in the direction of the static magnetic field. In the illustrated and described specimen head, the resonator cage containing the resonator has large, lateral openings 51, which permit observations of this type to be made. If necessary, tube portion 8 defining resonator 16 would have to be provided with appropriate holes whose diameter would, of course, have to be small enough to prevent the type of wave in the resonator from being influenced.

Figure 5:
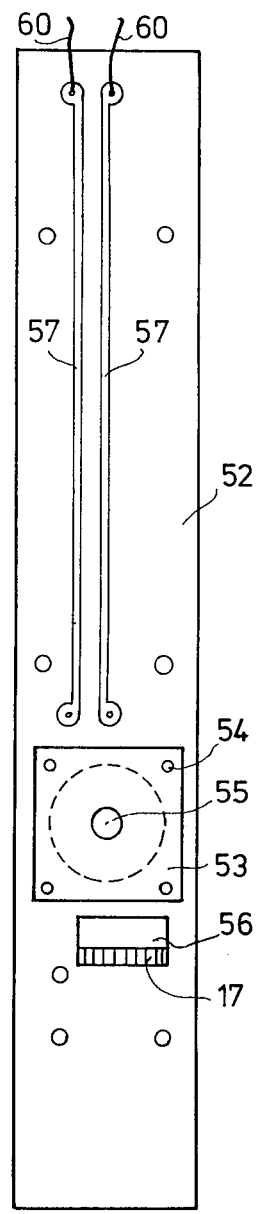
FIG. 5 shows a side elevation of the resonator portion, with attached printed circuit board.

The plane lateral surfaces of bearing block 4, on which, with the exception of one portion of toothed rim 17, there are no projecting members, permit additional means to be attached, in particular printed circuit boards 52, such as the one illustrated in FIG. 5. In the practical example shown in FIG. 5, printed circuit board 52 also has a large hole in the area of opening 51 in the resonator cage, with a coil mount 53, for example for modulation coils, being contained therein and also extending somewhat into opening 51 in resonator cage 9. Together with coil mount 53, printed circuit board 52 is attached to the exterior surface of resonator cage 9 by means of screws 54. It would also be possible to arrange temperature sensors, for example, on printed circuit board 52. Here, also, a central hole 55 permits the egress of light for ODMR experiments. A slot 56 provides the space required for the projecting portion of toothed rim 17. Leads can be run in the customary manner from the upper ends of the tracks 57 on printed circuit board 52 to head member 1, which is provided with connectors 58, 59 on both sides of connection flange 46 of the waveguide, with the leads 60 extending from tracks 57 being run thereto. The connectors can be BNC jacks, for example.

The invention has been described above on the basis of a preferred practical example. Obviously, many modifications and variations of the present invention are possible in the light of the above teachings. It should therefore be understood that within the scope of the appended claims, the invention may be practiced otherwise than as specifically described. In particular, individual characteristics of the invention can be employed individually or in combination one with the other.

We claim:

1. A specimen head for electron spin resonance and paramagnetic electron resonance measurements comprising:
   an annularly cylindrical resonator having two end walls,
   a waveguide, said waveguide being coupled to one of the end walls of said resonator,
   means including said waveguide for exciting an $H_{011}$ wave in said resonator.
   the other end wall of said resonator being formed by a piston having an opening for introducing a specimen into the resonator,
   said opening and said resonator being concentric,
   means for shifting said piston,
   means for altering the coupling of said waveguide to said resonator,
   a bearing block,
   a hollow piston rod,
   said piston being attached at the end of the hollow piston rod and mounted in the bearing block,
   said bearing block containing said resonator,
   said piston rod being concentric relative to the axis of said resonator and longitudinally shiftable,
   said waveguide being attached to said bearing block on that side of said resonator which is opposite said piston,
   said waveguide extending along the outside of said bearing block parallel to said piston rod,
   drive shafts, said drive shafts being arranged on the side of said piston rod opposite said waveguide in the plane containing the axes of said waveguide and said piston rod and are mounted to said bearing block,
   said drive shafts being connected to the means for shifting said piston,
   said means for shifting said piston engaging said piston rod and the means for altering the coupling of said waveguide,
   in which said bearing block is attached to the head member by means of rods extending parallel to said waveguide and said drive shafts,
   wherein the free end of said waveguide is attached to the head member,
   the free ends of said drive shafts being mounted in said head member,
   said head member having a hole to receive said piston rod.

2. The specimen head set forth in claim 1, in which a first of said drive shafts has a threaded portion, and further comprising a travel nut, said travel nut engaging said threaded portion and being connected with said piston rod.

3. The specimen head set forth in claim 2, in which said piston rod and said first drive shaft are mounted spaced apart, in which said piston rod and said first drive shaft are mounted in these locations with radial play, and in which the hole in said travel nut has a slightly smaller clearance to the axis of said piston rod than that of the bearing bores for said drive shaft to the bearing bores for said piston rod, thereby permitting radial play to be eliminated while permitting minor flexure of said drive shaft between said bearing points.

4. The specimen head set forth in claim 3, further comprising a bearing race attached to said bearing block, in which said drive shaft is mounted in said bearing race, said bearing race having eccentric holes for receiving said drive shaft.

5. The specimen head set forth in claim 1, in which said means for altering the coupling of said waveguide include a waveguide portion having an annular cross section and a rotatable slit diaphragm arranged between said resonator and one end of the waveguide portion, said waveguide portion being mounted rotatably about its longitudinal axis in said bearing block eccentrically to the axis of said resonator, said waveguide portion being provided with a toothed rim which is engaged by a gear arranged on one of said drive shafts.

6. The specimen head set forth in claim 5, in which said waveguide portion is pressed resiliently against the one end of said resonator by means of a helical compression spring surrounding said waveguide portion and being in a contact at its respective ends with said toothed rim and said bearing block.

7. The specimen head set forth in claim 1, in which said resonator is defined by a tube portion inserted in said bearing block.

8. The specimen head set forth in claim 7, in which said tube portion is of metallized ceramic.

9. The specimen head set forth in claim 1, in which said waveguide is retained in said head member such that it can be longitudinally shifted.

10. The specimen head set forth in claim 1, in which said drive shafts comprise a plurality of portions connected one with the other so as to prevent rotation while permitting longitudinal play.

11. The specimen head set forth in claim 1, further comprising gearing mounted in said head member, in which the upper ends of said drive shafts are in engagement with said gearing mounted in said head member.

12. The specimen head set forth in claim 1, in which a goniometer is arranged on said specimen head, the axis of rotation of said goniometer coinciding with the axis of said hole.

13. The specimen head set forth in claim 1, in which said bearing block has an opening therein, said resonator also has an opening therein, the openings being perpendicular to the plane of said waveguide and said drive shafts.

14. The specimen head set forth in claim 13, further comprising a fibre-optic rod which extends into said resonator, said rod being arranged in the hole in said head member, wherein the specimen to be examined is attached to the end of said fibre-optic rod located in said resonator.

15. The specimen head set forth in claim 1, further comprising a printed circuit board, said circuit board being attached to at least one lateral surface of said bearing block which extends parallel to the plane of said waveguide and said drive shafts, said printed circuit board permitting auxiliary means to be attached, and further comprising leads being run from said printed circuit board to connectors arranged on said head member.

16. The specimen head set forth in claim 1, in which said rods, said drive shafts and said waveguide have at least first portions adjacent to said head member, said first portions comprising a material having low thermal conductivity.

* * * * *